US012812888B2

(12) United States Patent
Liu et al.

(10) Patent No.: US 12,812,888 B2
(45) Date of Patent: Nov. 24, 2026

(54) METHOD OF MODULATING MULTI-GATE DEVICE CHANNELS AND STRUCTURES THEREOF

(71) Applicant: Taiwan Semiconductor Manufacturing Company, Ltd., Hsinchu (TW)

(72) Inventors: Ko-Cheng Liu, Hsinchu City (TW); Chang-Miao Liu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 499 days.

(21) Appl. No.: 18/157,054

(22) Filed: Jan. 19, 2023

(65) Prior Publication Data

US 2024/0113198 A1 Apr. 4, 2024

Related U.S. Application Data

(60) Provisional application No. 63/377,683, filed on Sep. 29, 2022.

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/17*** | (2025.01) |

(Continued)

(52) U.S. Cl.

CPC ........... *H10D 30/014* (2025.01); *H10D 30/43* (2025.01); *H10D 30/6735* (2025.01); *H10D 62/121* (2025.01); *H10D 62/235* (2025.01); *H10D 64/017* (2025.01); *H10P 30/204* (2026.01); *H10P 30/208* (2026.01); *H10P 30/22* (2026.01);

(Continued)

(58) Field of Classification Search

CPC . H10D 30/501–509; H10D 30/43–435; H10D 62/119–123; H10D 30/014; H10D 30/019–0198; H10D 62/121; Y10S 977/938; H01L 21/02694; H10K 71/211

See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |

(Continued)

FOREIGN PATENT DOCUMENTS

| | | | |
|---|---|---|---|
| CN | 110571154 | A | 12/2019 |
| TW | 201513266 | A | 4/2015 |

*Primary Examiner* — Matthew C Landau
*Assistant Examiner* — Nora T. Nix
(74) *Attorney, Agent, or Firm* — HAYNES AND BOONE, LLP

(57) ABSTRACT

A method of fabricating a device includes providing a plurality of fins extending from a substrate. In some embodiments, each fin of the plurality of fins includes a plurality of semiconductor channel layers. In various example, the method further includes performing an ion implantation process into a first fin of the plurality of fins to introduce a dopant species into a topmost semiconductor channel layer of the plurality of semiconductor channel layers of the first fin. In some embodiments, the ion implantation process deactivates the topmost semiconductor channel layer of the plurality of semiconductor channel layers of the first fin.

20 Claims, 9 Drawing Sheets

(51) Int. Cl.

| | |
|---|---|
| ***H10D 64/01*** | (2025.01) |
| ***H10P 30/20*** | (2026.01) |
| ***H10P 30/22*** | (2026.01) |
| ***H10P 32/10*** | (2026.01) |
| ***H10P 32/14*** | (2026.01) |

(52) U.S. Cl.
CPC ........ *H10P 32/1406* (2026.01); *H10P 32/171* (2026.01)

(56) References Cited

U.S. PATENT DOCUMENTS

| | | | | |
|---|---|---|---|---|
| 8,963,258 | B2 | 2/2015 | Yu et al. | |
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,576,814 | B2 | 2/2017 | Wu et al. | |
| 2013/0285116 | A1 | 10/2013 | Lochtefeld et al. | |
| 2015/0069328 | A1* | 3/2015 | Leobandung | B82Y 10/00 438/151 |
| 2018/0047835 | A1* | 2/2018 | Chao | H10D 30/014 |
| 2018/0212024 | A1* | 7/2018 | Cheng | B82Y 10/00 |
| 2021/0398977 | A1* | 12/2021 | Mishra | H10D 84/853 |
| 2023/0209798 | A1* | 6/2023 | Ong | H10D 84/8311 257/369 |

* cited by examiner

METHOD OF MODULATING MULTI-GATE DEVICE CHANNELS AND STRUCTURES THEREOF

PRIORITY

This application claims the benefits of U.S. Prov. App. Ser. No. 63/377,683, filed Sep. 29, 2022, the entire disclosure of which is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, a semiconductor IC may generally include a variety of different device types with different performance requirements. As such, providing a multi-gate device (e.g., such as a GAA transistor) that is able to meet such diverse device performance requirements remains a challenge. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
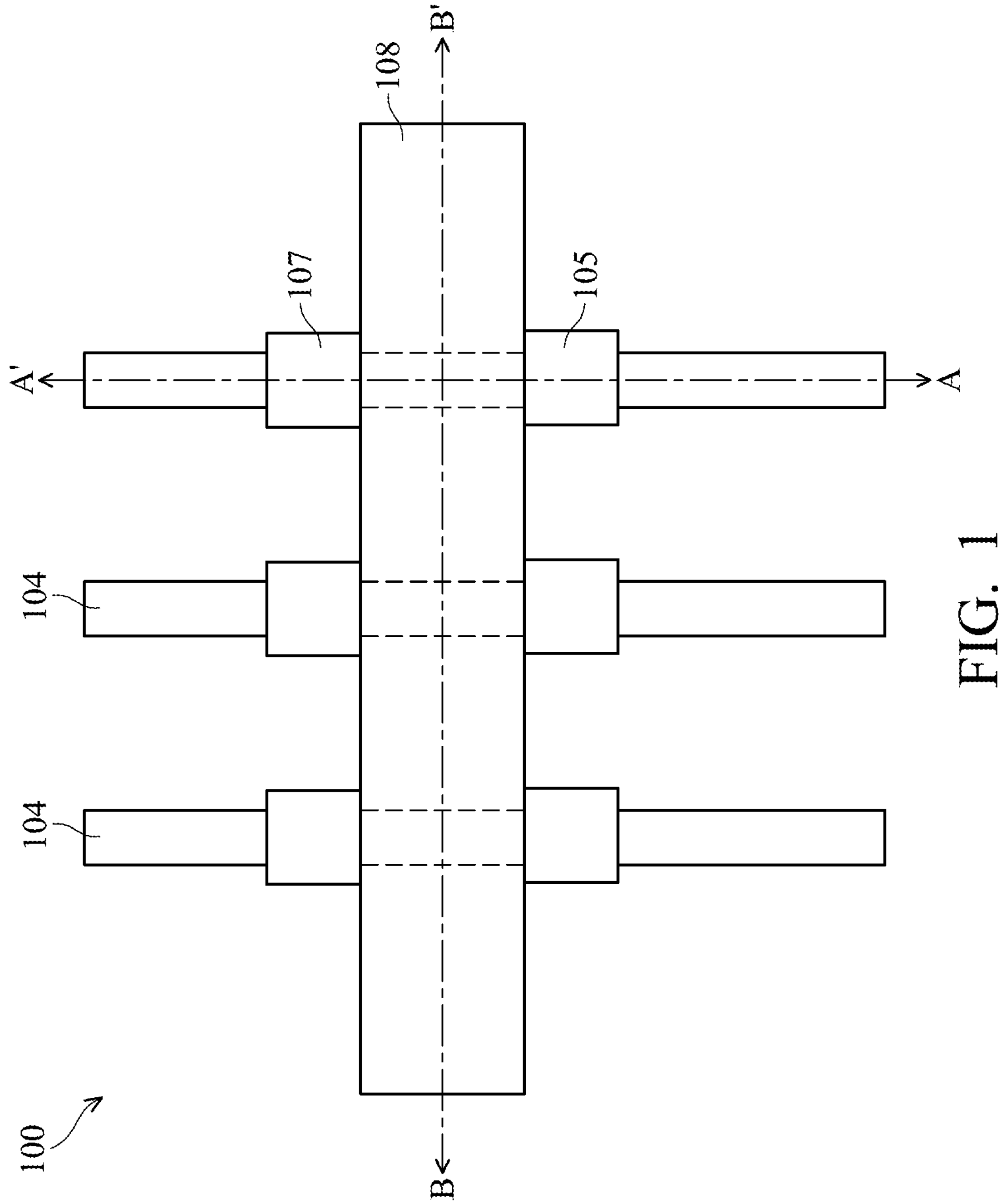
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with “about,” “approximate,” and the like, the term is intended to encompass numbers that are within a reasonable range including the number described, such as within +/−10% of the number described or other values as understood by person skilled in the art. For example, the term “about 5 nm” encompasses the dimension range from 4.5 nm to 5.5 nm.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having different numbers of semiconductor channel layers within a same process design framework. In some examples, a number of semiconductor channel layers for each of the given ones of the multi-gate devices may be selected based on the device type being implemented by the multi-gate device, or based on a desired threshold voltage (Vt) and current/voltage (I/V) characteristic (e.g., of a given multi-gate device as compared to a neighboring multi-gate device). As an example, GAA transistors may be used in a variety of device types such as core (logic) devices, static random-access memory (SRAM) devices, or other types of devices. In some embodiments, core (logic) devices may be implemented using a fewer number of semiconductor channel layers (e.g., as compared to SRAM devices) in order to reduce total device capacitance and provide increased device speed (e.g., including improved AC performance). In some cases, SRAM devices may be implemented using a greater number of semiconductor channel layers in order to provide increased cell current, as well as to reduce variation of transistor threshold voltage and transistor current. Other device types may similarly be implemented using GAA transistors, with the number of semiconductor channel layers being chosen based on particular design and/or performance requirements (e.g., such as a desired Vt and I/V characteristic).

In contrast to at least some existing implementations where a different number of semiconductor channel layers may be achieved by way of removal (e.g., by etching) of an unnecessary semiconductor channel layer, embodiments of the present disclosure provide for doping (e.g., by ion implantation) of a semiconductor channel layer to effectively deactivate the implanted semiconductor channel layer (e.g., by increasing a threshold voltage of the implanted semiconductor channel layer) and thus modulate the number of semiconductor channel layers in the device. For avoidance of doubt, it is noted that since a "deactivated" semiconductor channel layer is not actually removed by etching, the physical structure that defines the deactivated semiconductor channel layer may remain present; however, the deactivated semiconductor channel layer is electrically inert (e.g., no current flow during normal device operation). Thus, in the discussion that follows, reference to a "number of semiconductor channel layers" for a given fin refers to a number of electrically active semiconductor channel layers (e.g., semiconductor channel layers that have not been rendered inert by an ion implantation process). In addition, removal of a semiconductor channel layer, for example by etching, can cause damage to underlying epitaxial layers and lateral sidewall junctions with adjacent source/drain features, and can also detrimentally increase resistance between a contact metal and a source/drain feature. Generally, because of the good vertical control and lateral confinement provided by ion implantation and the straightforward energy and dosage tuning of the ion implantation process, control of an ion implantation process to deactivate a semiconductor channel layer is an easier and more reliable process than an etch process that physically removes a semiconductor channel layer. The disclosed embodiments also avoid the associated device damage and increased parasitic resistance associated with existing etch processes to remove an unwanted semiconductor channel layer. Moreover, by providing multi-gate devices having a number of semiconductor channel layers that may be selected based on the device type being implemented or based on particular design and/or performance requirements (e.g., such as a desired Vt and I/V characteristic), embodiments of the present disclosure provide methods and device structures that are able to meet the diverse performance requirements of a variety of different device types simultaneously. Moreover, as described in more detail below, the various embodiments disclosed herein and including multi-gate devices with different numbers of semiconductor channel layers may be fabricated using a single, contiguous process flow. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. In some embodiments, the term "source/drain region(s)" may refer to a source or a drain, individually or collectively dependent upon the context. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
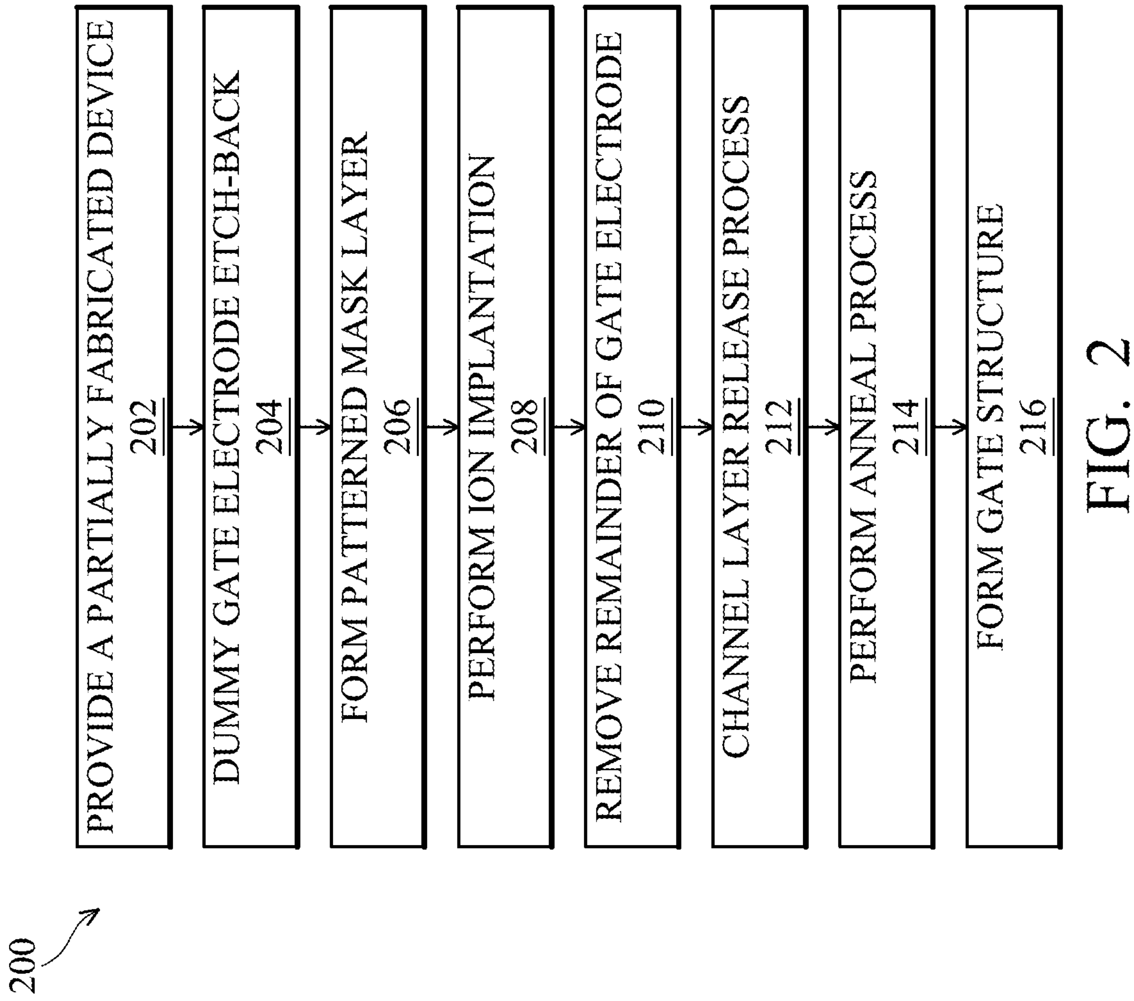
FIG. 2 is a flow chart of a method of fabricating a semiconductor device 300, according to one or more aspects of the present disclosure.

Referring to FIG. 2, illustrated therein is a method 200 of semiconductor fabrication including fabrication of a semiconductor device 300 (e.g., which includes a multi-gate device) having different numbers of semiconductor channel layers on a single substrate, where the number of semiconductor channel layers for a given multi-gate device may be selected based on a device type being implemented, in accordance with various embodiments. It will be understood that aspects of the method 200 may be applied to a variety of device types such as core (logic) devices, SRAM devices, or other types of multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is noted that certain aspects of the method 200 may be described as being performed in a region of the semiconductor device 300 including a particular device type. However, if not described as being performed in a region including a particular device type, the step of the method 200 being described may be assumed as being performed across a plurality of regions including a plurality of devices types (e.g., across a plurality of device type regions). Further, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 200, including any descriptions given with reference to the figures are merely exemplary and are not intended to be limiting beyond what is specifically recited in the claims that follow.

Figure 3B:
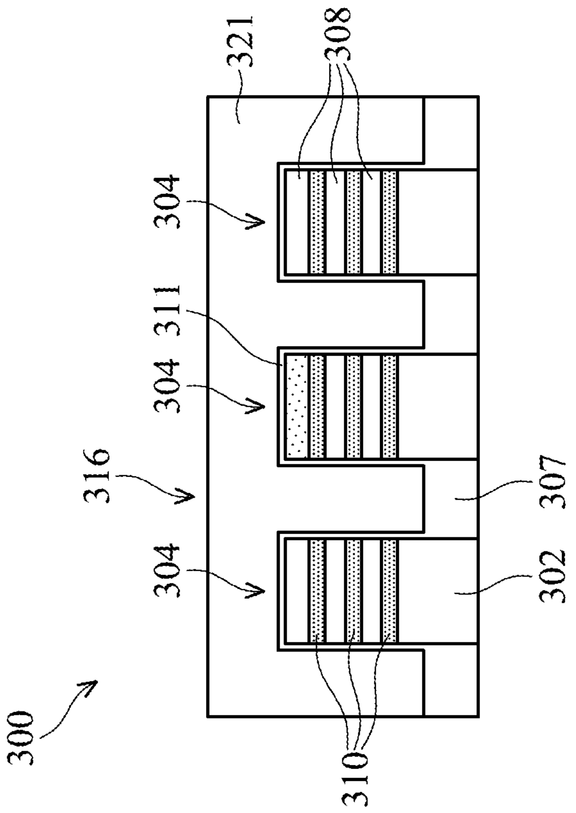
FIGS. 3B/4B/5B/6/7B/8B provide a cross-sectional views of an embodiment of the semiconductor device 300 along a plane substantially parallel to a plane defined by section BB' of FIG. 1, in accordance with some embodiments.
Figure 3A:
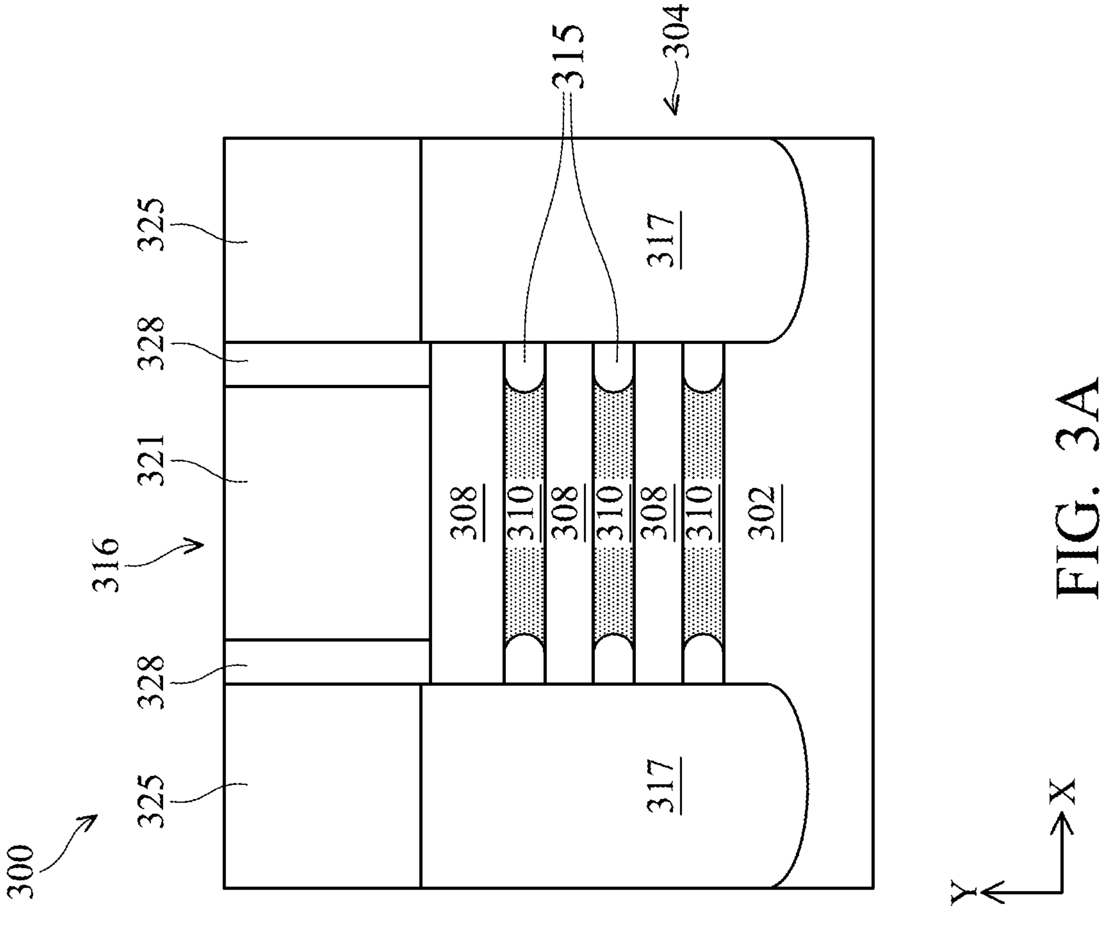
FIGS. 3A/4A/5A/7A/8A provide cross-sectional views of an embodiment of the semiconductor device 300 along a plane substantially parallel to a plane defined by section AA' of FIG. 1, in accordance with some embodiments.

The method 200 begins at block 202 where a partially fabricated semiconductor device 300 is provided. Referring to the example of FIGS. 3A/3B, in an embodiment of block 202, a substrate including fins 304 extending therefrom is provided. FIG. 3A provides a cross-sectional view of an embodiment of the semiconductor device 300 along a plane substantially parallel to a plane defined by section AA' of FIG. 1, and FIG. 3B provides a cross-sectional view of an embodiment of the semiconductor device 300 along a plane substantially parallel to a plane defined by section BB' of FIG. 1. In some embodiments, the substrate may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

As shown in FIGS. 3A/3B, the device 300 includes fins 304 having a substrate portion 302 (formed from the underlying substrate), epitaxial layers 308 of a first composition and epitaxial layers 310 of a second composition that interpose the layers 308 of the first composition. In some cases, trench isolation (STI) features 307 may be formed to isolate each of the fins 304 from neighboring fins. In an embodiment, the epitaxial layers 308 of the first composition include silicon (Si) and the epitaxial layers of the second composition 310 include silicon germanium (SiGe). It is also noted that while the layers 308, 310 are shown as having a particular stacking sequence within the fins 304, where the layer 308 is the topmost layer of a stack of layers 308, 310, other configurations are possible. For example, in some cases, the layer 310 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

In various embodiments, the epitaxial layers 308 (e.g., including the first composition), or portions thereof, may form a channel region of a GAA transistor of the device 300. For example, the layers 308 may be referred to as semiconductor channel layers that are used to form a channel region of a GAA transistor. In various embodiments, the semiconductor channel layers (e.g., the layers 308 or portions thereof) may include nanosheet channel(s), nanowire channel(s), bar-shaped channel(s), and/or other suitable channel configurations. The semiconductor channel layers may also be used to form portions of the source/drain features of the device 300.

It is noted that while the fins 304 are illustrated as including three (3) layers of the epitaxial layer 308 and three (3) layers of the epitaxial layer 310, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 308, and thus the number of semiconductor channel layers, is between 2 and 10.

In some embodiments, the epitaxial layers 308 each have a thickness range of about 4-8 nanometers (nm), and the epitaxial layers 310 each have a thickness range of about 4-8 nm. As noted above, the epitaxial layers 308 may serve as channel region(s) for a subsequently formed multi-gate device (e.g., a GAA transistor) and their thickness may be chosen based at least in part on device performance considerations. The epitaxial layers 310 may serve to define a gap distance between adjacent channel region(s) for the subsequently formed multi-gate device and their thickness may also be chosen based at least in part on device performance considerations.

In some embodiments, and as shown in FIG. 3B, the device 300 may include a dummy layer 311 formed over the fins 304. In some embodiments, the dummy layer 311 includes dummy oxide layer such as a silicon oxide layer or a silicon oxynitride layer, although other oxide layers may be equally used. In some cases, the dummy layer 311 may include a SiGe cladding layer. The dummy layer 311 may be deposited conformally over each of the fins 304. By way of example, the dummy layer 311 may be deposited by a CVD process, an ALD process, an MBE process, and/or other suitable process. In various embodiments, the dummy layer 311 is a sacrificial layer that is removed at a subsequent processing stage. In some cases, the dummy layer 311 may be used to increase a gate area density of the GAA transistors formed on the semiconductor device 300. For instance, in a gate region of the device 300, an area occupied by the dummy layer 311 may subsequently be replaced by a gate structure (e.g., including a dielectric layer and a metal gate layer). In some cases, the dummy layer 311 has a thickness in a range of about 4-16 nm. In various embodiments, the thickness of the dummy layer 311 may be selected to provide a desired area density for the subsequently formed gate structure (e.g., to provide a lower gate resistance), while also providing an adequate process window for fabrication of the semiconductor device 300.

The device 300 further includes a gate stack 316 formed over the fins 304 of the device 300. In an embodiment, the gate stack 316 is dummy (sacrificial) gate stack that is subsequently removed and replaced by a final gate stack at a subsequent processing stage of the device 300. For example, the gate stack 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fins 304 underlying the gate stack 316 may be referred to as channel regions of the device 300. The gate stack 316 may also define a source/drain region of the fins 304, for example, including the regions of the fins 304 adjacent to and on opposing sides of the channel region.

In some embodiments, the gate stack 316 includes a dielectric layer and an electrode layer 321 formed over the dielectric layer. In some embodiments, the dielectric layer includes silicon oxide. Alternatively, or additionally, the dielectric layer may include silicon nitride, a high-K dielectric material or other suitable material. In some embodiments, the electrode layer 321 may include polycrystalline silicon (polysilicon). In some examples, an optional sacrificial layer may be formed directly beneath the dielectric layer. The optional sacrificial layer may include SiGe, Ge, or other appropriate material, and may be used in some cases to prevent nanosheet loss (e.g., such as loss of material from the epitaxial layers 308, 310) during previous processing steps.

In some embodiments, one or more spacer layers 328 may be formed on sidewalls of the gate stack 316. In some cases, the one or more spacer layers 328 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the one or more spacer layers 328 include multiple layers, such as main spacer layers, liner layers, and the like.

As shown in FIG. 3A, the device 300 may further include inner spacers 315. In some embodiments, formation of the inner spacers 315 may first include a source/drain etch process to form trenches in source/drain regions adjacent to and on either side of the gate stack 316, where the trenches expose underlying portions of the substrate, as well as lateral surfaces of the epitaxial layers 308, 310. Thereafter, a lateral etch of the epitaxial layers 310 (SiGe layers), followed by deposition and etch-back of a dielectric material to form the inner spacers 315. In some embodiments, the inner spacers 315 include amorphous silicon. In some examples, the inner spacers 315 may include silicon oxide, silicon nitride, silicon carbide, silicon oxynitride, SiCN, silicon oxycarbide, SiOCN, a low-K material (e.g., with a dielectric constant 'k'<7), and/or combinations thereof. In various examples, the inner spacer layers 315 may extend beneath the one or more spacer layers 328 (formed on sidewalls of the gate stack 316) while abutting subsequently formed source/drain features, as described below.

Still referring to FIG. 3A, the device 300 also includes source/drain features 317. In some embodiments, the source/drain features 317 are formed in source/drain regions adjacent to and on either side of the gate stack 316. For example, the source/drain features 317 may be formed within the trenches formed just prior to formation of the inner spacers 315, as discussed above, over the exposed substrate portion and in contact with the adjacent inner spacers 315 and the semiconductor channel layers (the epitaxial layers 308). In some embodiments, the source/drain features 317 are formed by epitaxially growing a semiconductor material layer in the source/drain regions. In various embodiments, the semiconductor material layer grown to form the source/drain features 317 may include Ge, Si, GaAs, AlGaAs, SiGe, GaAsP, SiP, or other suitable material. The source/drain features 317 may be formed by one or more epitaxial (epi) processes. In some embodiments, the source/drain features 317 may be in-situ doped during the epi process. For example, in some embodiments, the source/drain features 317 may be doped with an N-type dopant species such as phosphorous, arsenic, antimony, or other suitable dopant species such as carbon. In some embodiments, the source/drain features 317 may be doped with a P-type dopant species such as boron, $BF_2$, or other suitable dopant species such as carbon. As an example, the source/drain features 317 may include epitaxially grown SiGe or Si doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 317 are not in-situ doped, and instead an implantation process is performed to dope the source/drain features 317. In some embodiments, formation of the source/drain features 317 may be performed in separate processing sequences for each of N-type and P-type source/drain features. In some cases, and after formation of the source/drain features 317, an annealing process may be performed (e.g., such as a rapid thermal anneal, laser anneal, or other suitable annealing process). It is noted that in some embodiments, the source/drain features 317 may be epitaxially grown such that they extend above a top surface of their respective fins 304, being referred to as raised source/drain features.

As also shown in FIG. 3A, the device 300 further includes an inter-layer dielectric (ILD) layer 325. In some embodiments, a contact etch stop layer (CESL) may be formed over the device 300 prior to forming the ILD layer 325. In some embodiments, the ILD layer 325 includes materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The ILD layer 325 may be deposited by a PECVD process or other suitable deposition technique. In some embodiments, after formation of the ILD layer 325, the device 300 may be subject to a high thermal budget process to anneal the ILD layer 325. In some cases, after depositing the ILD layer 325, a planarization process may be performed to expose a top surface of the gate stack 316. For example, a planarization process includes a CMP process which removes portions of the ILD layer 325 (and CESL, if present) overlying the gate stack 316 and planarizes a top surface of the device 300. In some embodiments, the CMP process may expose the underlying electrode layer 321, such as a polysilicon electrode layer, of the dummy gate stack 316.

The method 200 proceeds to block 204 where the dummy gate electrode is etched-back. Referring to the example of FIGS. 3A/3B and 4A/4B, in an embodiment of block 204, the exposed electrode layer 321 of the gate stack 316 is etched-back by a suitable etching process. For example, the electrode layer 321 may be etched-back using a wet etch, a dry etch, or a combination thereof. In some cases, the etching-back of the electrode layer 321 forms an opening 405 in a gate region of a fin 304 the device 300, where the one or more spacer layers 328 are disposed along sidewalls of the opening 405. In some embodiments, and as a result of etching-back the electrode layer 321, the underlying dielectric layer of the gate stack 316 may be exposed at least along a top surface of each of the fins 304. Alternatively, in some cases, the etching-back of the electrode layer 321 may also remove the underlying dielectric layer of the gate stack 316 from the top surface of each of the fins 304 to expose the dummy layer 311. In still other embodiments, the etching-back of the electrode layer 321 may also remove the dummy layer 311, at least from the top surface of each of the fins 304, to expose a topmost semiconductor channel layer (topmost epitaxial layer 308) of each of the fins 304.

Figure 4B:
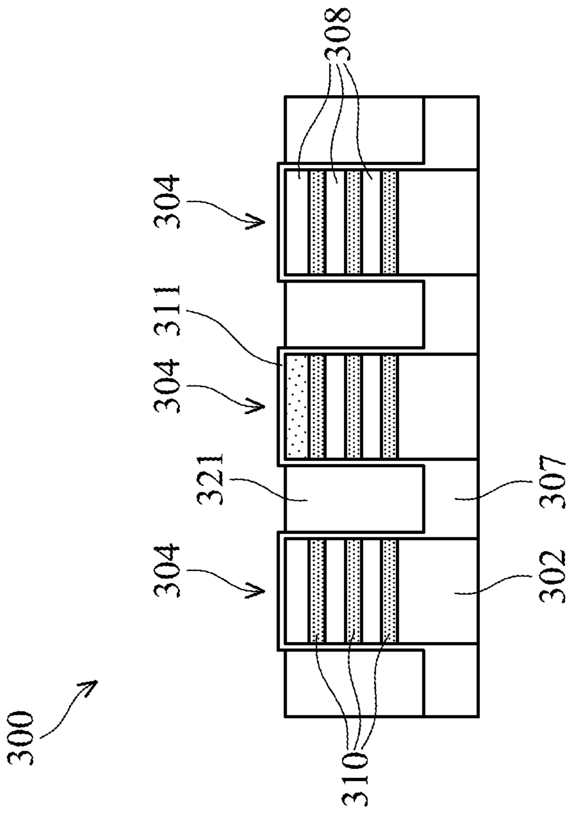
Figure 4A:
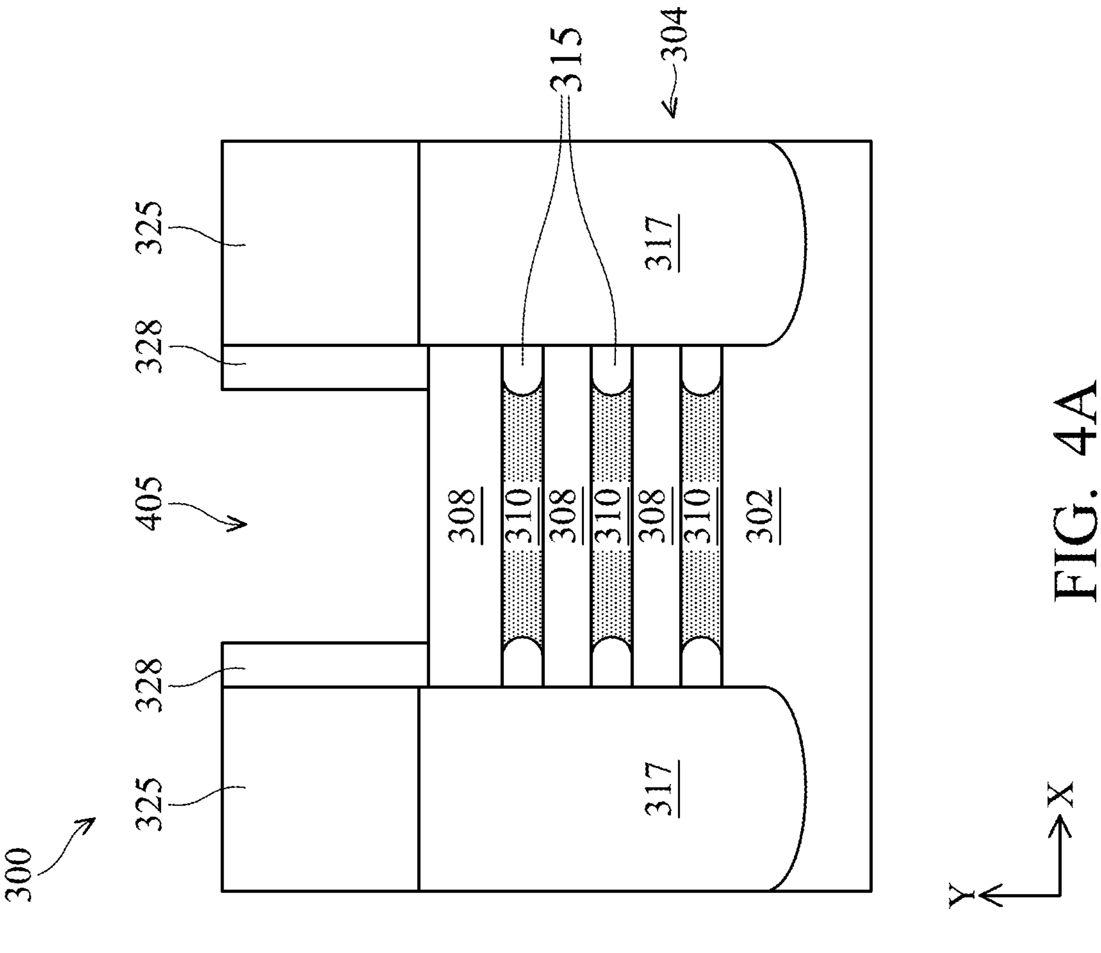

The method 200 proceeds to block 206 where a patterned mask layer is formed. Referring to the example of FIGS. 4A/4B and 5A/5B, in an embodiment of block 206, a mask layer may be deposited and patterned to form a patterned mask layer 507 having an opening 509 that exposes a particular one (or in some cases more than one) of the fins 304, while other, adjacent fins 304 remain protected by the patterned mask layer 507. Further, the gate region of the particular one of the fins 304 is exposed by the opening 405, formed as described above, while other portions of the particular fin 304 (exposed by the opening 509) remain protected (e.g., by the ILD layer 325 and the one or more spacer layers 328). In some embodiments, the particular one of the fins 304 that is exposed by the opening 509 in the patterned mask layer 507 may correspond to a fin that will be used to form a particular type of device (e.g., such as a logic device) for which a few number of semiconductor channel layers is desired (e.g., as compared to another device type formed on another fin 304). More generally, the particular one of the fins 304 that is exposed by the opening 509 may correspond to a fin that will be used to form a particular device and/or for which a different threshold voltage (Vt) and current/voltage (I/V) characteristic is desired (e.g., as compared to devices formed on neighboring fins 304). In some cases, the particular one of the fins 304 may further correspond to a first device type region, and neighboring fins 304 may correspond to other device regions (e.g., a second device region, a third device region, etc.).

In various embodiments, and still with reference to block 206 of the method 200, the mask layer may include a photoresist (resist) layer, an anti-reflective coating, a hard mask layer (e.g., silicon oxide, silicon nitride, silicon oxynitride, silicon carbide, or other appropriate hard mask layer), or a combination thereof. In one example, the mask layer may include a bottom anti-reflective coating (BARC) formed over the device 300 and a resist layer formed over the BARC layer such that the patterned mask layer 507 includes a patterned BARC layer and a patterned resist layer formed over the patterned BARC layer. In some cases, if only a resist layer is used, the deposited resist layer may be patterned (e.g., by exposure and development of the resist layer) to form the patterned mask layer 507. Alternatively, if a BARC layer (and/or hard mask layer) is used, a pattern may be initially formed in the resist layer (e.g., by exposure and development), after which the pattern may be transferred to an underlying BARC layer (and/or hard mask layer), for example by etching, to form the patterned mask layer 507.

The method 200 proceeds to block 208 where an ion implantation process is performed. Referring again to the example of FIGS. 5A/5B, after formation of the patterned mask layer 507 and in an embodiment of block 208, an ion implantation process 511 is performed into the gate region of the particular one of the fins 304 (exposed by the opening 405 and the opening 509) to introduce a dopant species into a topmost semiconductor channel layer (topmost epitaxial layer 308) to form an implanted topmost epitaxial layer 308A. In some examples, the implanted dopant species is chosen so as to increase a threshold voltage (Vt) of the implanted topmost epitaxial layer 308A. For instance, if the fin 304 that is exposed by the opening 509 is used to form an N-type transistor, the implanted dopant species may include a P-type dopant species such as boron (B), thereby increasing the Vt of the implanted topmost epitaxial layer 308A. Stated another way, for an N-type transistor, the implanted dopant species may include a group III element. Alternatively, if the fin 304 that is exposed by the opening 509 is used to form a P-type transistor, the implanted dopant species may include an N-type dopant species such as phosphorous (P), arsenic (As), antimony (Sb), or a combination thereof, thereby increasing the Vt of the implanted topmost epitaxial layer 308A. Stated another way, for a P-type transistor, the implanted dopant species may include a group V element. In other words, the implanted dopant species may have an opposite conductivity type (anti-type dopant species) as compared to the conductivity type of the transistor formed in the fin 304 exposed by the opening 509.

Figure 9:
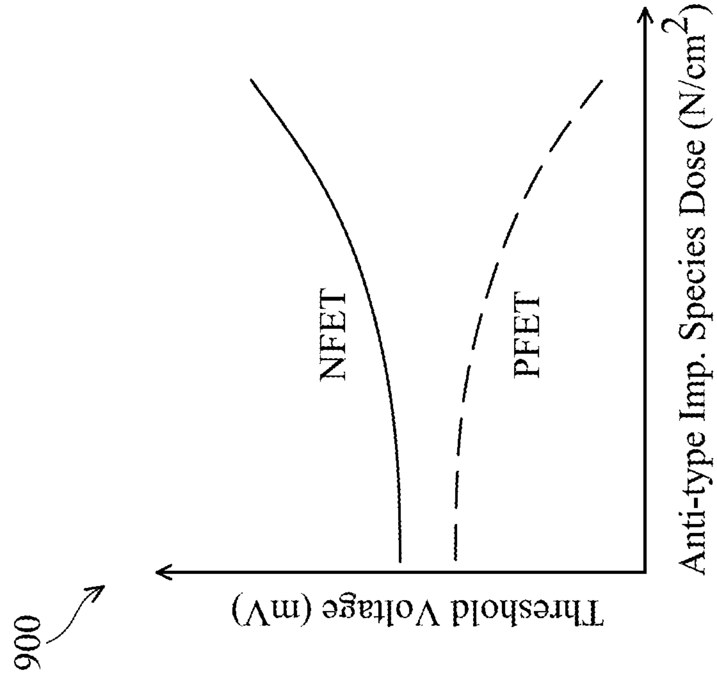
FIG. 9 provides a graph qualitatively illustrating the relationship between threshold voltage and dopant species dose, in accordance with some embodiments.

By way of example, and with reference to FIG. 9, the relationship between the opposite conductivity type implanted dopant species dose (labeled as 'Anti-type Imp. Species Dose) and threshold voltage (Vt) modulation of the implanted topmost epitaxial layer 308A for N-type transistors (labeled 'NFET') and P-type transistors (labeled 'PFET') is qualitatively illustrated in graph 900. As shown, for N-type transistors, an increasing opposite conductivity type implanted dopant species dose increases the Vt of the implanted topmost epitaxial layer 308A (absolute Vt becomes more positive). Similarly, for P-type transistors, an increasing opposite conductivity type implanted dopant species dose increases the Vt of the implanted topmost epitaxial layer 308A (absolute Vt becomes more negative). In some embodiments, if the Vt tuning (Vt increase) is sufficiently large, the implanted topmost epitaxial layer 308A will be effectively deactivated (e.g., under normal operating conditions such as a nominal power supply voltage). For example, in some embodiments, if the Vt of the implanted topmost epitaxial layer 308A is about 1.5×-3× the value of the Vt of the non-implanted epitaxial layers 308, then the implanted topmost epitaxial layer 308A will effectively remain in an OFF-state (e.g., not conducting current) during normal operating conditions of the non-implanted epitaxial layers 308 (e.g., in an ON-state conducting current). In some cases, the Vt of the implanted topmost epitaxial layer 308A may be increased by between about 50-200%, as compared to the value of the Vt of the non-implanted epitaxial layers 308. In some cases, the deactivation of the implanted topmost epitaxial layer 308A may be equivalently referred to as sheet blocking.

Figure 5B:
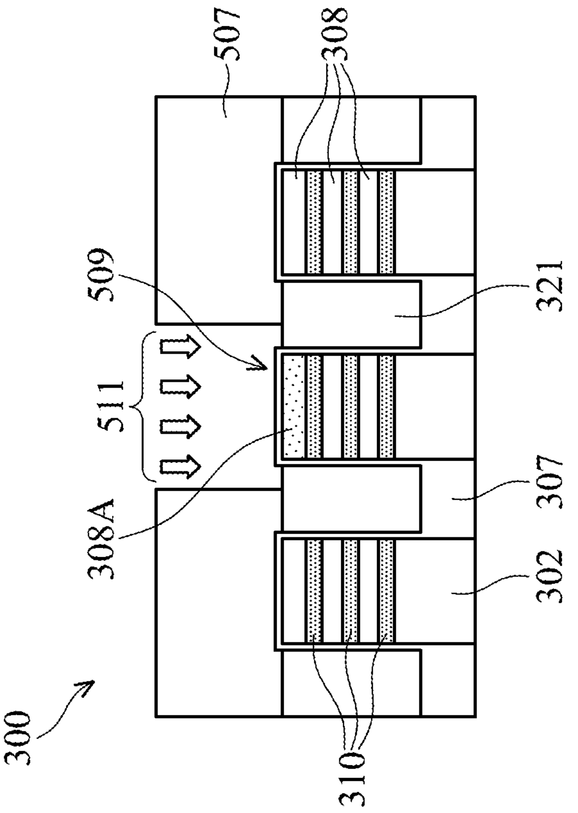
Figure 5A:
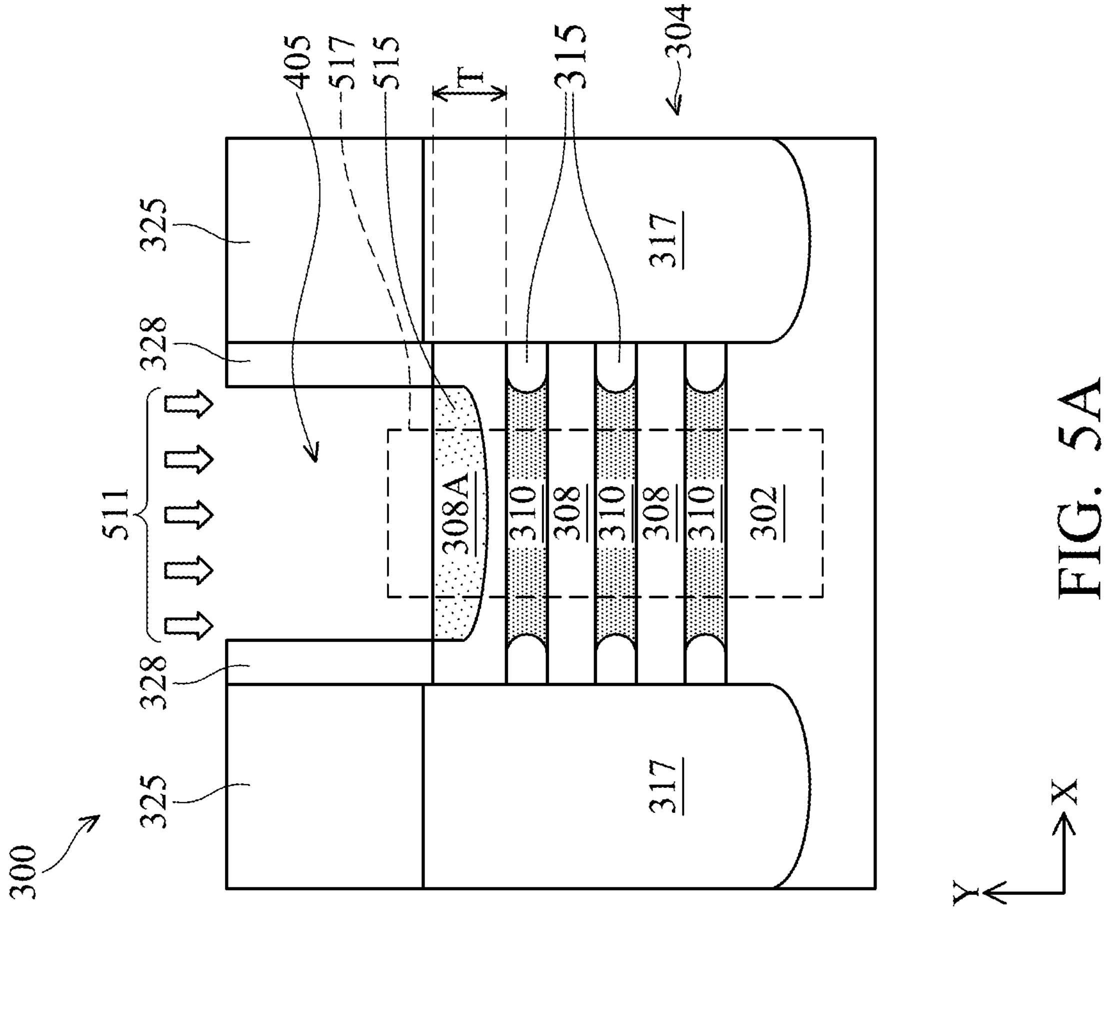

In various embodiments, the ion implantation process 511 is performed with careful control of the implanted ion projected range, Rp, which defines the average depth of the implanted ions. Generally, in some embodiments, the projected range is defined such that the average depth of the implanted ions is contained within the topmost epitaxial layer 308 (e.g., between top and bottom surfaces of the topmost epitaxial layer 308). As shown in FIG. 5A, an ion-implanted portion 515 of the implanted topmost epitaxial layer 308A may not necessarily include an entire thickness T of the implanted topmost epitaxial layer 308A. However, as described further below, a subsequent anneal process may be performed to further distribute the dopant species from the ion-implanted portion 515 more uniformly across the thickness T of the implanted topmost epitaxial layer 308A.

Figure 10:
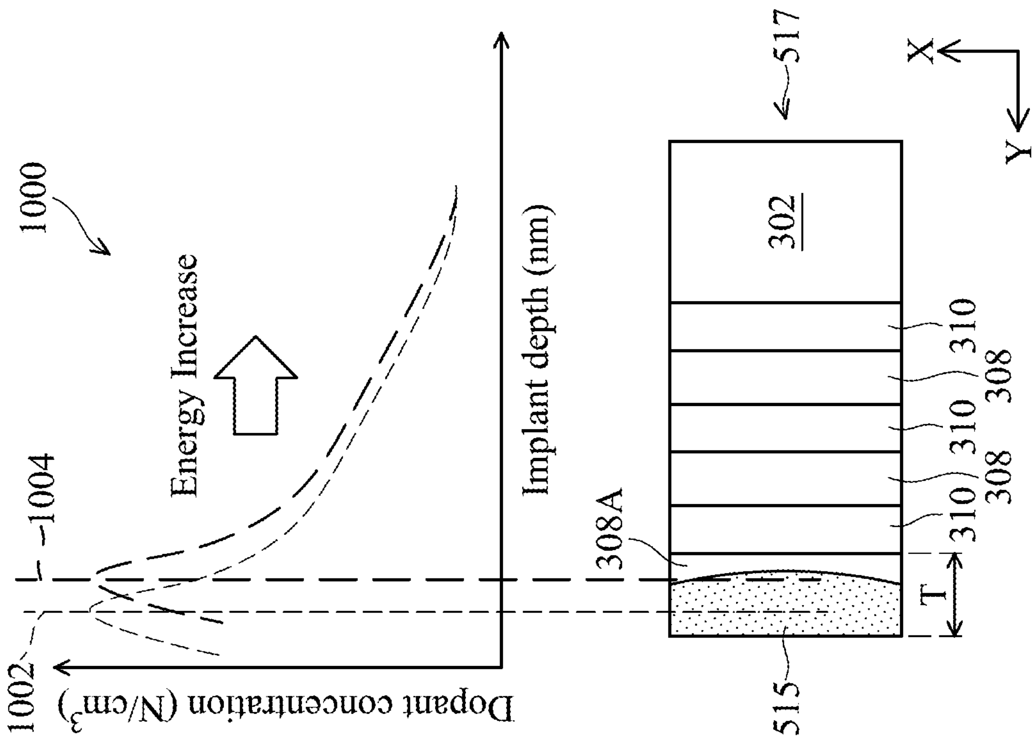
FIG. 10 provides a graph illustrating dopant concentration versus implant depth and a corresponding section of the device of FIG. 5A, qualitatively showing where a projected range of an implanted dopant species would be defined within an implanted topmost epitaxial layer, in accordance with some embodiments.

To further illustrate this point, reference is made to FIG. 10, which shows dopant concentration (of the implanted topmost epitaxial layer 308A) versus implant depth in graph 1000 along a top portion of the figure, and a corresponding section 517 of the device 300 of FIG. 5A (rotated counter-clockwise by 90 degrees) that includes the implanted topmost epitaxial layer 308A, the non-implanted epitaxial layers 308, 310, and the substrate portion 302, along a bottom portion of the figure. The dopant concentration versus implant depth is shown for two different exemplary implant energies, with the higher implant energy depicted using a dashed line. For each of the exemplary implant energies, vertical lines 1002, 1004 are drawn through the peaks of each of the curves, where the peaks correspond to the implanted ion projected range, Rp. The vertical lines 1002, 1004 also extend down through the corresponding section 517, in particular through the implanted topmost epitaxial layer 308A, to qualitatively show where the projected range would be defined within the implanted topmost epitaxial layer 308A. As expected, the higher energy implant results in a deeper implant depth (deeper projected range, Rp). However, both of the exemplary implant energies still ensure that the projected range remains contained within the topmost epitaxial layer 308. FIG. 10 also shows how the ion-implanted portion 515 of the implanted topmost epitaxial layer 308A, even for the two different exemplary implant energies, may not necessarily include the entire thickness T of the implanted topmost epitaxial layer 308A.

Byway of example, control of the implanted ion projected range, Rp, including control of the implant energy and dose, is particularly important in order to avoid affecting (e.g., unintentionally doping) other semiconductor channel layers (epitaxial layers 308) that are disposed beneath the topmost semiconductor channel layer. As merely one example, for instance when boron (B) is implanted into the topmost semiconductor channel layer (topmost epitaxial layer 308) of an N-type transistor, the implant energy may be about 0.1-2 KeV and the implant species dose may be about $1E^{13}$-$1E^{15}$ N/cm$^2$ in order to provide a Vt tuning/modulation of about +100-200 mV for the implanted topmost epitaxial layer 308A of the N-type transistor. In an example of a P-type transistor, phosphorous (P) or arsenic (As) may be implanted into the topmost semiconductor channel layer (topmost epitaxial layer 308) using an implant energy of about 0.1-5 KeV and an implant species dose of about $1E^{13}$-$1E^{15}$ N/cm$^2$ in order to provide a Vt tuning/modulation of about 100-200 mV (negative Vt modulation for P-type transistors, to increase Vt) for the implanted topmost epitaxial layer 308A of the P-type transistor. It is also noted that in various embodiments, the epitaxial layer 310 (SiGe layer) directly below the topmost epitaxial layer 308A may serve as a buffer layer that helps to control and/or contain potential channeling/tailing of the implant.

Generally, the ion implantation process 511 may be performed at a variety of tilt angles such as between about zero degrees (substantially perpendicular to the substrate) and 20 degrees, to avoid implant shadowing effects, although other implant angles are possible. In some embodiments, the ion implantation process 511 may be performed at a variety of implant energies such as between about 0.1-5 KeV, although other implant energies are possible. Additionally, in some embodiments, the ion implantation process 511 may be performed at a variety of implant species doses such as between about $1E^{13}$-$1E^{15}$ N/cm$^2$, although other implant species doses are possible. In some embodiments, the ion implantation process 511 may be performed through one or both of the dielectric layer of the gate stack 316 and the dummy layer 311, if present, along the top surface of the fin 304. In not present, then the ion implantation process 511 may be performed directly into the topmost semiconductor channel layer. As a result of the ion implantation process 511, and in accordance with various embodiments, the effective number of semiconductor channel layers in the device formed using the particular one of the fins 304 (exposed by the opening 405 and the opening 509 and implanted by the ion implantation process 511) is modulated, for example by deactivation of an implanted topmost semiconductor channel layer, as compared to the number of semiconductor channel layers in devices formed using neighboring fins 304 (which were not implanted by the ion implantation process 511). After performing the ion implantation process 511, the patterned mask layer 507 is removed (e.g., such as by using an appropriate etchant, solvent, or ashing process).

In the present example, the number of semiconductor channel layers (epitaxial layers 308) for the implanted fin 304 was illustrated as being reduced from three (3) to two (2) by deactivation of the topmost semiconductor channel layer, while neighboring, adjacent fins 304 have three (3) semiconductor channel layers (epitaxial layers 308). It will be understood that this is example is merely exemplary, and other embodiments are possible. For instance, in some cases, the number of semiconductor channel layers for the implanted fin 304 may be effectively reduced from four (4) to three (3) by deactivation of the topmost semiconductor channel layer, while neighboring, adjacent fins 304 have four (4) semiconductor channel layers. More generally, in various embodiments, the number of semiconductor channel layers for the implanted fin 304 may equal to N−1, while neighboring, adjacent fins 304 have N semiconductor channel layers.

It is further noted that in at least some embodiments, the parameters (e.g., energy, dose) of the ion implantation process 511 may be adjusted, and/or multiple ion implantation processes 511 (e.g., each with a different energy and/or dose) may be performed, such that multiple semiconductor channel layers (epitaxial layers 308) are implanted with the anti-type implant species and thus deactivated. For example, in some cases, the top two (2) semiconductor channel layers (e.g., a topmost and a second topmost semiconductor channel layer) may be deactivated (e.g., by one or more ion implantation processes 511) such that the number of semiconductor channel layers (epitaxial layers 308) for the implanted fin 304 is reduced from three (3) to one (1), while neighboring, adjacent fins 304 have three (3) semiconductor channel layers. In some embodiments, the number of semiconductor channel layers for the implanted fin 304 may be effectively reduced from four (4) to two (2) by deactivation of the top two (2) semiconductor channel layer, while neighboring, adjacent fins 304 have four (4) semiconductor channel layers. More generally, in various embodiments, the number of semiconductor channel layers for the implanted fin 304 may equal to N−2, while neighboring, adjacent fins 304 have N semiconductor channel layers.

In still other embodiments, there may be multiple implanted fins 304 (e.g., used to form different device types, and/or having different Vt and I/V characteristic requirements), where the ion implantation process 511 into each of the multiple implanted fins 304 may be different. In one case, consider a first fin 304 which is not implanted by the ion implantation process 511, a second fin 304 which is implanted by one or more ion implantation processes 511 having first parameters (e.g., energy, dose), and a third fin 304 which is implanted by one or more ion implantation processes 511 having second parameters (e.g., energy, dose) different than the first parameters. By way of example, the second fin 304 may have a topmost semiconductor channel layer implanted with the anti-type implant species and thus deactivated, and the third fin 304 may have the top two (2) semiconductor channel layers implanted with the anti-type implant species and thus deactivated. Thus, in some cases, the number of semiconductor channel layers (epitaxial layers 308) for the first fin 304 (non-implanted) may be three (3), the number of semiconductor channel layers for the second fin 304 is reduced from three (3) to two (2), and the number of semiconductor channel layers for the third fin 304 is reduced from three (3) to one (1). In other embodiments, the number of semiconductor channel layers (epitaxial layers 308) for the first fin 304 (non-implanted) may be four (4), the number of semiconductor channel layers for the second fin 304 is reduced from four (4) to three (3), and the number of semiconductor channel layers for the third fin 304 is reduced from four (4) to two (2). More generally, in various embodiments, the number of semiconductor channel layers for the first fin 304 (non-implanted) may be equal to N, the number of semiconductor channel layers for the second fin 304 may be equal to N−1, and the number of semiconductor channel layers for the third fin 304 may be equal to N−2. While various examples of deactivating one or more semiconductor channel layers within a given fin 304, or across multiple fins 304, have been given, it will be understood that these example are merely exemplary, and other embodiments including different combinations of deactivated semiconductor channel layers are possible.

Figure 6:
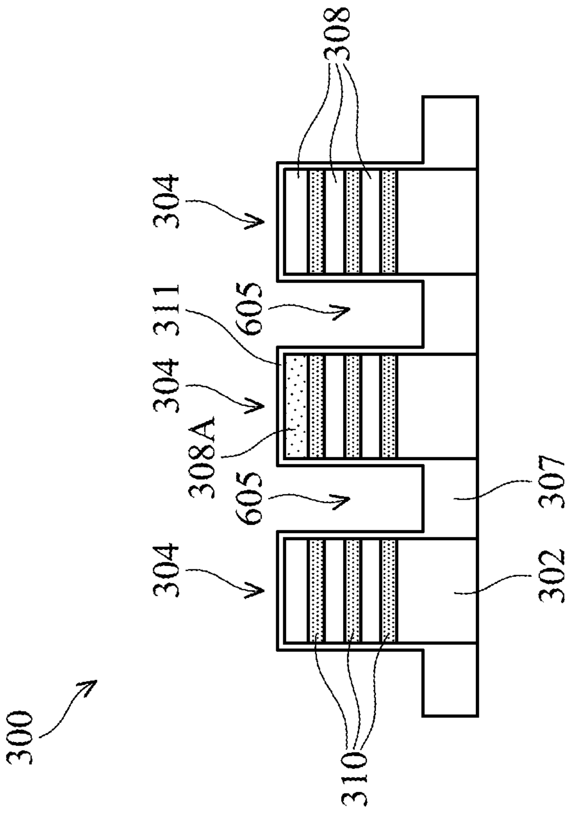

The method 200 proceeds to block 210 where a remainder of the dummy gate electrode is removed. Referring to the example of FIGS. 5B and 6, in an embodiment of block 210 and after removal of the patterned mask layer 507, the remaining portion of the electrode layer 321 (e.g., the etched-back electrode layer 321) is removed using a suitable etching process. For example, the etched-back electrode layer 321 may be removed using a wet etch, a dry etch, or a combination thereof. In some cases, removal of the etched-back electrode layer 321 forms openings 605 between adjacent fins 304 and may expose sidewalls of the fins 304 including the epitaxial layers 308, 308A, 310. In some embodiments, and as a result of removal of the etched-back electrode layer 321, the underlying dielectric layer of the gate stack 316 may be exposed along top and sidewall surfaces of each of the fins 304. Alternatively, in some cases, the removal of the etched-back electrode layer 321 may also remove the underlying dielectric layer of the gate stack 316 from the top and sidewall surfaces of each of the fins 304 to expose the dummy layer 311. In still other embodiments, the removal of the etched-back electrode layer 321 may also remove the dummy layer 311, from the top and sidewall surfaces of each of the fins 304, to fully expose the epitaxial layers 308, 310 (of the non-implanted fins 304) and the epitaxial layers 308, 308A, 310 (of the implanted fin 304).

Figure 7B:
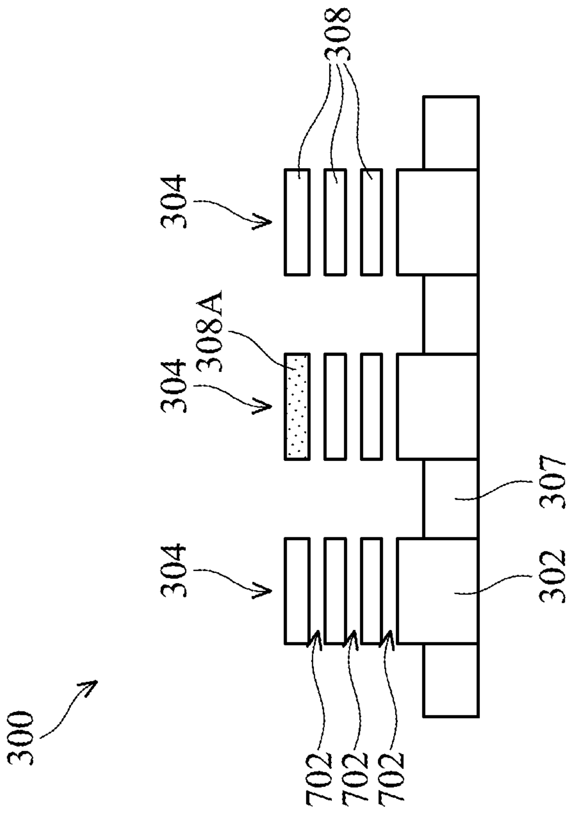
Figure 7A:
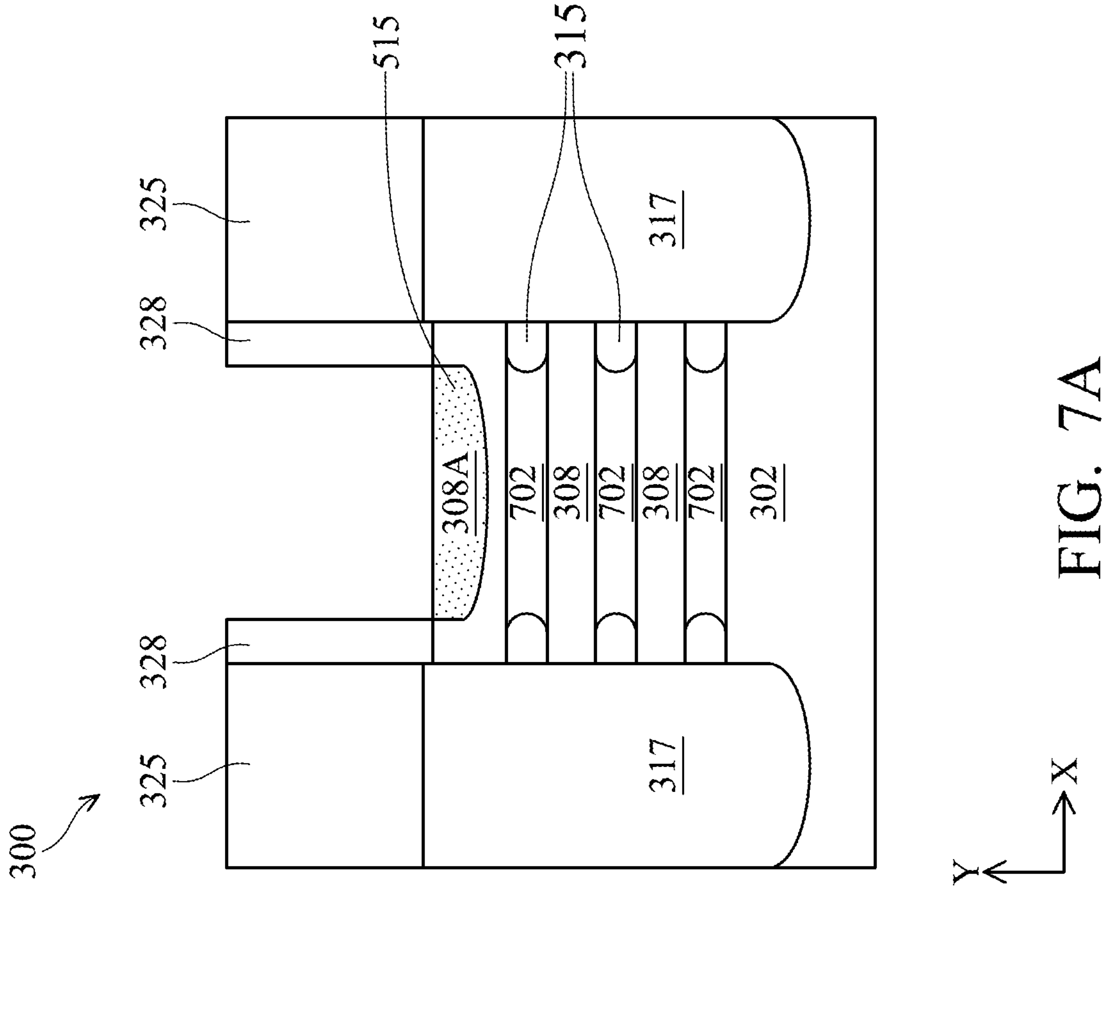

The method 200 proceeds to block 212 where a semiconductor channel release process is performed. Referring to the example of FIGS. 6 and 7A/7B, in an embodiment of block 212, the dielectric layer of the gate stack 316 and the dummy layer 311, if still present, may initially be removed by a suitable etching process such as a wet etch, a dry etch, or a combination thereof. After removal of the dielectric layer of the gate stack 316 and the dummy layer 311 (if present), and in a further embodiment of block 212, a selective removal of the SiGe layers (e.g., the epitaxial layers 310) in the channel region of devices formed in each of the fins 304 is performed. In some embodiments, the SiGe layers are removed from the fins 304 within the openings provided by the removal of the etched-back electrode layer 321, as well as the dielectric layer of the gate stack 316 and the dummy layer 311 (if present). In various examples, the SiGe layers (e.g., the epitaxial layers 310) are removed from the exposed fins 304 using a selective wet etching process. In some embodiments, the selective wet etching includes ammonia and/or ozone. As merely one example, the selective wet etching includes tetra-methyl ammonium hydroxide (TMAH). In an embodiment, the epitaxial layers 310 are SiGe and the epitaxial layers 308, 308A are silicon, allowing for the selective removal of the SiGe layers. It is noted after selective removal of the SiGe layers, gaps 702 are formed between the adjacent semiconductor channel layers in the channel region of devices formed in each of the fins 304. In some examples, the semiconductor channel layer release process may equivalently be referred to as a sheet formation process.

Figure 8B:
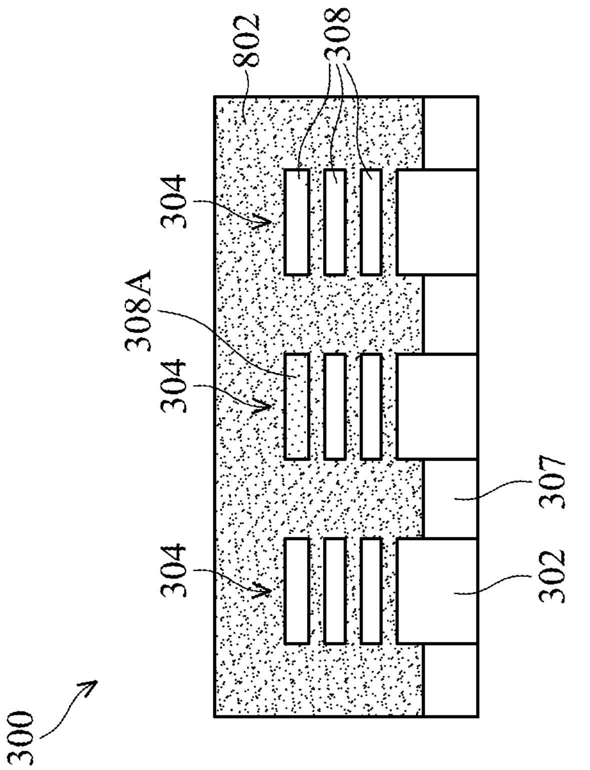
Figure 8A:
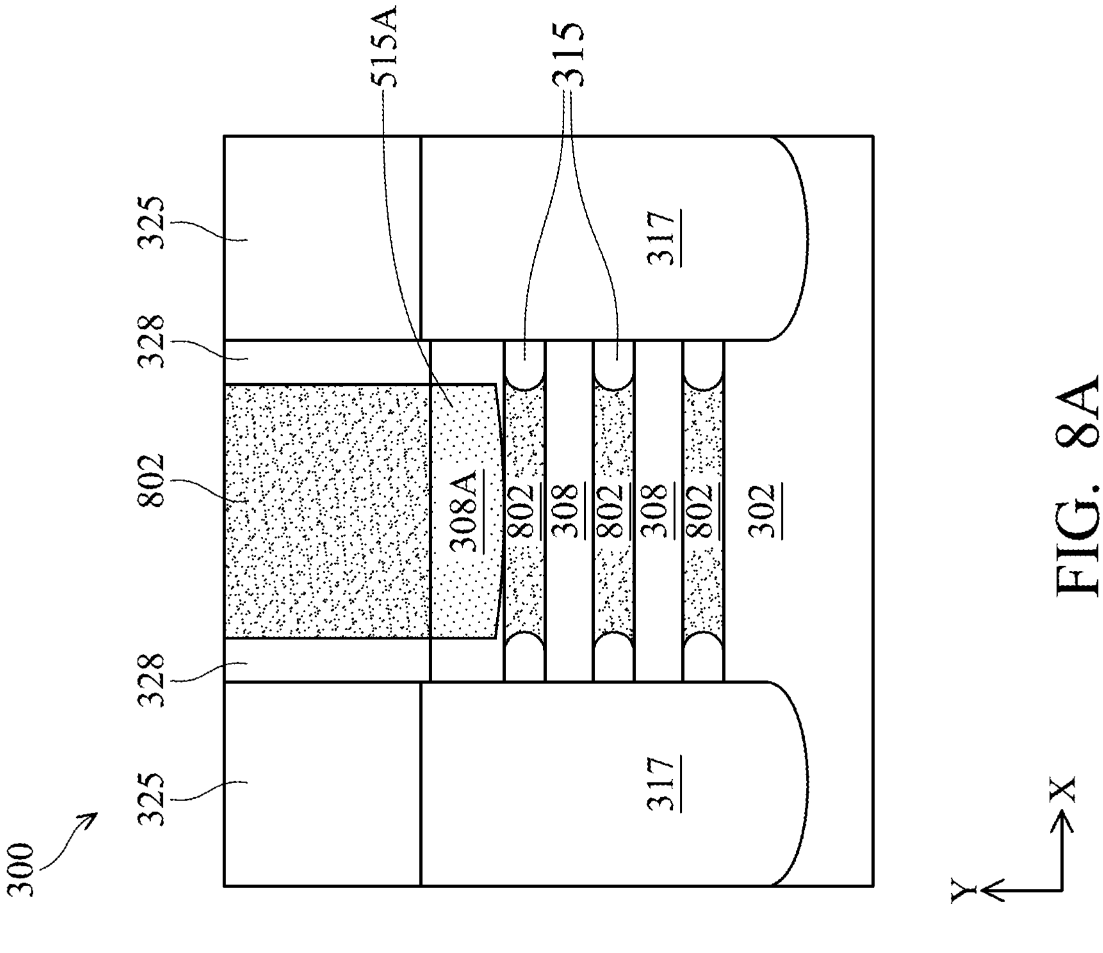

The method 200 proceeds to block 214 where an anneal process is performed. Referring to the example of FIGS. 7A/7B and 8A/8B, in an embodiment of block 214, an anneal process is performed. As previously noted, the anneal process may be performed to distribute the dopant species from the ion-implanted portion 515 more uniformly across the thickness T of the implanted topmost epitaxial layer 308A. This is best illustrated with reference to FIGS. 7A and 8A, where the ion-implanted portion 515 (before anneal) spreads out (or diffuses), for example, across the thickness T of the implanted topmost epitaxial layer 308A to provide an ion-implanted portion 515A (after anneal). The anneal process thus helps to ensure that an entirety of the topmost semiconductor channel layer is deactivated, and that portions of the topmost semiconductor channel layer do not unintentionally turn on during normal device operation. It is noted that in accordance with various embodiments, the anneal process of block 214 is performed after the semiconductor channel release process of block 212. By performing the anneal process after the semiconductor channel release process, potential diffusion paths (e.g., across the epitaxial layers 310) are blocked/removed by the gaps 702, thus ensuring that only the semiconductor channel layer(s) targeted for deactivation are in fact deactivated and generally avoiding unintentional doping of other semiconductor channel layers (e.g., such as the epitaxial layers 308 disposed beneath the implanted topmost epitaxial layer 308A, in the present example). In some cases, the anneal process may be performed at a temperature of between about 900-1100 degrees Celsius. For instance, in some embodiments, the anneal process may be performed at a temperature of about 1000 degrees Celsius. In various embodiments, the anneal process of block 214 includes a spike anneal, such as a laser spike annealing (LSA) process. More generally, the anneal process may include a millisecond annealing (MSA) process, a microsecond annealing process, or other rapid thermal process (RTP). By using such annealing processes, greater control of dopant diffusion range is provided with a shorter process time.

The method 200 then proceeds to block 216 where a gate structure is formed. Still referring to the example of FIGS. 7A/7B and 8A/8B, in an embodiment of block 216, a gate structure 802 is formed for the devices formed in each of the fins 304. The gate structure 802 described herein may include a high-K/metal gate stack, however other compositions are possible. In some embodiments, the gate structure 802 may form the gate associated with the multi-channels provided by the plurality of exposed semiconductor channel layers (the exposed epitaxial layers 308, 308A, now having gaps 702 there between) in the channel regions of the devices formed in each of the fins 304. In some embodiments, the gate structure 802 includes a gate dielectric that is initially formed within the trench provided by the removal of the dummy gate and/or by the release of the semiconductor channel layers, as described above. In various embodiments, the gate dielectric includes an interfacial layer (IL) and a high-K gate dielectric layer formed over the interfacial layer. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer may include a high-K dielectric layer such as hafnium oxide ($HfO_2$). Alternatively, the high-K gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

In a further embodiment of block 216, the gate structure 802 further includes a metal gate including a metal layer formed over the gate dielectric. The metal layer may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the device 300. In some embodiments, the metal layer of the gate structure 802 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer may be formed by ALD, PVD, CVD, e-beam evaporation, or other suitable process. Further, the metal layer may be formed separately for N-type and P-type transistors which may use different metal layers. In addition, the metal layer may provide an N-type or P-type work function, may serve as a transistor (e.g., GAA transistor) gate electrode, and in at least some embodiments, the metal layer may include a polysilicon layer. With respect to the GAA transistors shown and discussed, the gate structure includes portions that interpose each of the epitaxial layers 308, which each provide semiconductor channel layers for the GAA transistors, and the epitaxial layer 308A, which is deactivated and does not provide a semiconductor channel layer for the GAA transistors.

Generally, the semiconductor device 300 may undergo further processing to form various features and regions known in the art. For example, in some embodiments, a cut metal gate process may be performed after formation of the gate structure 802 to isolate the metal layers of adjacent gate structures (e.g., formed on adjacent fins 304). The cut metal gate process may include removing a portion of the gate structure 802 in a cut metal gate region to form a trench, followed by deposition of a dielectric material (e.g., an oxide- and/or nitride-based dielectric material) to electrically isolate the metal layers of adjacent gate structures. Subsequent processing may further form contact openings, contact metal, as well as various contacts/vias/lines and multilayer interconnect features (e.g., metal layers and interlayer dielectrics) on the substrate, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor, it will be understood that other device configurations are possible.

It is also noted that while the above discussion focused on deactivation of one or more semiconductor channel layers by increasing a threshold voltage of an ion-implanted semiconductor channel layer, other embodiments are possible. For instance, in some cases, the implanted dopant species used for the ion implantation process 511 may include bombardment of germanium (Ge), nitrogen (N), or a combination thereof to physically damage/destroy the target semiconductor channel layer(s) (e.g., such as the topmost semiconductor channel layer or others, as described above), thereby effectively deactivating the target semiconductor channel layer(s). In other embodiments, rather than deactivation of one or more semiconductor channel layers by sufficiently increasing a threshold voltage of an ion-implanted semiconductor channel layer, it may be possible to reduce a threshold voltage of one or more target semiconductor channel layer(s) to simply modify the Vt and I/V characteristics of the target semiconductor channel layers(s), without necessarily deactivating the target semiconductor channel layer(s). In such an example, the implanted dopant species of the ion implantation process 511 may have the same conductivity type as compared to the conductivity type of the transistor formed in the fin 304. For instance, an N-type transistor may be implanted with an N-type dopant species, and a P-type transistor may be implanted with a P-type dopant species. In some cases, a P-type transistor may be implanted with germanium (Ge). In some cases, reduction of the threshold voltage may result in the target semiconductor channel layer(s) being in a normally-ON state. It is further noted that by deactivating a semiconductor channel layer (e.g., such as a topmost semiconductor channel layer) by way of the ion implantation process 511, as described above, it is possible to avoid and/or substantially mitigate the mesa-leakage penalty. For instance, in some existing implementations, there may be a parasitic leakage path for the very bottom (or "mesa") substrate portion 302. By carefully controlling the doping of the one or more target semiconductor channel layer(s) using the ion implantation process 511, this parasitic leakage path can be substantially blocked and/or controlled.

With respect to the description provided herein, disclosed are methods and structures for providing multi-gate devices (e.g., such as a GAA transistors) having different numbers of semiconductor channel layers within a same process design framework. In some examples, a number of semiconductor channel layers for each of the given ones of the multi-gate devices may be selected based on the device type being implemented by the multi-gate device, or based on a desired threshold voltage (Vt) and current/voltage (I/V) characteristic (e.g., of a given multi-gate device as compared to a neighboring multi-gate device). In contrast to at least some existing implementations where a different number of semiconductor channel layers may be achieved by way of removal (e.g., by etching) of an unnecessary semiconductor channel layer, embodiments of the present disclosure provide for doping (e.g., by ion implantation) of a semiconductor channel layer to effectively deactivate the implanted semiconductor channel layer (e.g., by increasing a threshold voltage of the implanted semiconductor channel layer) and thus modulate the number of semiconductor channel layers in the device. Generally, because of the good vertical control and lateral confinement provided by ion implantation and the straightforward energy and dosage tuning of the ion implantation process, control of an ion implantation process to deactivate a semiconductor channel layer is an easier and more reliable process than an etch process that physically removes a semiconductor channel layer. The disclosed embodiments also avoid the associated device damage and increased parasitic resistance associated with existing etch processes to remove an unwanted semiconductor channel layer. Moreover, by providing multi-gate devices having a number of semiconductor channel layers that may be selected based on the device type being implemented or based on particular design and/or performance requirements (e.g., such as a desired Vt and I/V characteristic), embodiments of the present disclosure provide methods and device structures that are able to meet the diverse performance requirements of a variety of different device types simultaneously. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method that includes providing a plurality of fins extending from a substrate. In some embodiments, each fin of the plurality of fins includes a plurality of semiconductor channel layers. In various example, the method further includes performing an ion implantation process into a first fin of the plurality of fins to introduce a dopant species into a topmost semiconductor channel layer of the plurality of semiconductor channel layers of the first fin. In some embodiments, the ion implantation process deactivates the topmost semiconductor channel layer of the plurality of semiconductor channel layers of the first fin.

In another of the embodiments, discussed is a method that includes providing a first fin including a first plurality of channel layers interposed by a first plurality of SiGe layers and a second fin adjacent to the first fin, where the second fin includes a second plurality of channel layers interposed by a second plurality of SiGe layers. In some embodiments, the method further includes performing a first ion implantation process into the first fin to introduce a first anti-type implant species into a topmost channel layer of the first plurality of channel layers of the first fin. In some examples, the method further includes performing a second ion implantation process into the second fin to introduce a second anti-type implant species into two topmost channel layers of the second plurality of channel layers of the second fin. In some embodiments, the first ion implantation process deactivates the topmost channel layer of the first plurality of channel layers, and the second ion implantation process deactivates the two topmost channel layers of the second plurality of channel layers.

In yet another of the embodiments, discussed is a semiconductor device having a first fin extending from a substrate and including a first transistor, where the first fin includes a first gate structure and a first source/drain feature adjacent to the first gate structure. In some embodiments, the semiconductor device further includes a second fin extending from the substrate and including a second transistor, where the second fin includes a second gate structure and a second source/drain feature adjacent to the second gate structure. In some examples, the first fin has a first number of semiconductor channel layers in lateral contact with the first source/drain feature, the second fin has a second number of semiconductor channel layers in lateral contact with the second source/drain feature, and at least one of the semiconductor channel layers of the first fin or the second fin is electrically inert.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

providing a plurality of fins extending from a substrate, wherein each fin of the plurality of fins includes a plurality of semiconductor channel layers; and after etching-back a gate structure disposed over a channel region of a first fin of the plurality of fins, performing an ion implantation process into the first fin of the plurality of fins to introduce a dopant species into a topmost semiconductor channel layer of the plurality of semiconductor channel layers of the first fin;

wherein the ion implantation process deactivates the topmost semiconductor channel layer of the plurality of semiconductor channel layers of the first fin; and wherein the ion implantation process forms an ion-implanted portion within the topmost semiconductor channel layer, and wherein the ion-implanted portion includes less than an entire thickness of the topmost semiconductor channel layer.

2. The method of claim 1, wherein the dopant species increases a first threshold voltage (Vt) of the topmost semiconductor channel layer.

3. The method of claim 2, wherein the first Vt of the topmost semiconductor channel layer is greater than a second Vt of other semiconductor channel layers of the plurality of semiconductor channel layers.

4. The method of claim 2, wherein the first fin is used to form an N-type transistor, and wherein the dopant species includes a P-type dopant species.

5. The method of claim 2, wherein the first fin is used to form a P-type transistor, and wherein the dopant species includes an N-type dopant species.

6. The method of claim 1, wherein the deactivated topmost semiconductor channel layer does not conduct current under normal operating conditions of the semiconductor device.

7. The method of claim 1, wherein a second fin of the plurality of fins has N semiconductor channel layers, and wherein the first fin effectively has N−1 semiconductor channel layers.

8. The method of claim 1, further comprising:

prior to performing the ion implantation process, forming a patterned mask layer that exposes the first fin while other fins of the plurality of fins remain protected by the patterned mask layer; and performing the ion implantation process.

9. The method of claim 1, further comprising:

after performing the ion implantation process, performing a semiconductor channel release process, wherein the semiconductor channel release process selectively removes silicon germanium (SiGe) layers that interpose adjacent semiconductor channel layers within each of the plurality of fins to form gaps between the adjacent semiconductor channel layers within each of the plurality of fins.

10. The method of claim 9, further comprising:

after performing the semiconductor channel release process, performing an anneal process, wherein the anneal process forms a distribution of implanted dopants across an entire thickness of the topmost semiconductor channel layer.

11. The method of claim 1, wherein the ion implantation process includes bombardment of germanium (Ge) or nitrogen (N) to physically destroy the topmost semiconductor channel layer.

12. A method, comprising:

providing a first fin including a first plurality of channel layers interposed by a first plurality of silicon germanium (SiGe) layers and a second fin adjacent to the first fin, the second fin including a second plurality of channel layers interposed by a second plurality of SiGe layers;

performing a first ion implantation process into the first fin to introduce a first anti-type implant species into a topmost channel layer of the first plurality of channel layers of the first fin; and performing a second ion implantation process into the second fin to introduce a second anti-type implant species into two topmost channel layers of the second plurality of channel layers of the second fin;

wherein the first ion implantation process deactivates the topmost channel layer of the first plurality of channel layers, and wherein the second ion implantation process deactivates the two topmost channel layers of the second plurality of channel layers.

13. The method of claim 12, wherein a third fin is adjacent to at least one of the first fin and the second fin, wherein the third fin includes N channel layers, wherein the first fin includes N−1 channel layers, and wherein the second fin includes N−2 channel layers.

14. The method of claim 12, wherein the first fin and the second fin are used to form different device types.

15. The method of claim 12, wherein the first ion implantation process is performed using a different energy or dose than the second ion implantation process.

16. The method of claim 12, wherein the first anti-type implant species increases a first threshold voltage (Vt) of the topmost channel layer of the first plurality of channel layers, and wherein the second anti-type implant species increases a second Vt of the two topmost channel layers of the second plurality of channel layers.

17. The method of claim 12, further comprising:

after performing the second ion implantation process, selectively etching the first plurality of SiGe layers from the first fin and the second plurality of SiGe layers from the second fin; and after selectively etching the first and second plurality of SiGe layers, performing an anneal process.

18. A semiconductor device, comprising:

a first fin extending from a substrate and including a first transistor, wherein the first fin includes a first gate structure and a first source/drain feature adjacent to the first gate structure; and a second fin extending from the substrate and including a second transistor, wherein the second fin includes a second gate structure and a second source/drain feature adjacent to the second gate structure;

wherein the first fin has a first number of semiconductor channel layers in lateral contact with the first source/drain feature, wherein the second fin has a second number of semiconductor channel layers in lateral contact with the second source/drain feature, wherein a topmost channel layer of the semiconductor channel layers of the first fin is in a normally-ON state and is doped with a dopant species having a same conductivity type as the first source/drain feature, and wherein two topmost channel layers of the semiconductor channel layers of the second fin are electrically inert.

19. The semiconductor device of claim 18, wherein the two topmost channel layers of the second fin that are electrically inert have a first threshold voltage (Vt) that is greater than a second Vt of other semiconductor channel layers of the second fin.

20. The semiconductor device of claim 18, wherein the topmost channel layer of the first fin that is in the normally-ON state has a first threshold voltage (Vt) that is less than a second Vt of other semiconductor channel layers of the first fin.

* * * * *